(12) United States Patent
Rahman

(10) Patent No.: US 9,030,081 B2
(45) Date of Patent: May 12, 2015

(54) PIEZOELECTRIC DEVICE

(75) Inventor: Shariman Bin Abdul Rahman, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 640 days.

(21) Appl. No.: 13/396,608

(22) Filed: Feb. 15, 2012

(65) Prior Publication Data
US 2012/0206020 A1 Aug. 16, 2012

(30) Foreign Application Priority Data

Feb. 15, 2011 (JP) ................. 2011-029329

(51) Int. Cl.
*H01L 41/09* (2006.01)
*H03H 9/10* (2006.01)

(52) U.S. Cl.
CPC .................. *H03H 9/1014* (2013.01)

(58) Field of Classification Search
USPC ......................................... 310/344, 348, 365
See application file for complete search history.

(56) References Cited

U.S. PATENT DOCUMENTS

| | | | |
|---|---|---|---|
| 5,841,217 A * | 11/1998 | Kizaki et al. | 310/348 |
| 6,274,968 B1 * | 8/2001 | Wajima et al. | 310/348 |
| 6,946,778 B2 * | 9/2005 | Miura | 310/348 |
| 2008/0157630 A1 * | 7/2008 | Takahashi | 310/328 |
| 2009/0066190 A1 * | 3/2009 | Harima | 310/348 |
| 2012/0049695 A1 * | 3/2012 | Ichikawa | 310/344 |
| 2012/0074816 A1 * | 3/2012 | Mizusawa | 310/344 |

FOREIGN PATENT DOCUMENTS

| | | |
|---|---|---|
| CN | 1533031 | 9/2004 |
| CN | 101557207 | 10/2009 |
| JP | 08-316769 | 11/1996 |
| JP | 2002-158558 | 5/2002 |
| JP | 2004-80068 | 3/2004 |
| JP | 2004-328258 | 11/2004 |
| JP | 2005-260727 | 9/2005 |
| JP | 2006-33413 | 2/2006 |

(Continued)

OTHER PUBLICATIONS

"Office Action of Japan Counterpart Application", mailed on Oct. 14, 2014, p. 1-p. 4, in which references were cited.

(Continued)

*Primary Examiner* — Thomas Dougherty
(74) *Attorney, Agent, or Firm* — Jianq Chyun IP Office

(57) ABSTRACT

A piezoelectric device capable of adjusting shape/position of connection electrodes is provided to accommodate a first or second oscillating plate (piezoelectric). The second oscillating plate is shorter than the first oscillating plate, each oscillating plate includes an excitation and an extraction electrodes. The extraction electrode is electrically connected with a connection electrode via conductive adhesive agent in a package. The package includes a carrier section, carrying the first or the second oscillating plate thereon. The connection electrode is disposed on at least a portion of a surface of the carrier section. When the extraction electrode of the first oscillating plate is electrically connected with the connection electrode, the excitation electrode on one side of the first oscillating plate is not electrically connected with the connection electrode on the other side. The extraction electrodes of the second oscillating plate can be electrically connected with the connection electrodes.

10 Claims, 10 Drawing Sheets

(56) References Cited

FOREIGN PATENT DOCUMENTS

| JP | 2006-345482 | 12/2006 |
| JP | 2009-239414 | 10/2009 |

OTHER PUBLICATIONS

"1st Office Action of China Counterpart Application", issued on Dec. 12, 2014, p. 1-p. 5, in which references were cited.

* cited by examiner

US 9,030,081 B2

PIEZOELECTRIC DEVICE

CROSS-REFERENCE TO RELATED APPLICATIONS

This application claims the priority benefit of Japan application serial no. 2011-029329, filed on Feb. 15, 2011. The entirety of the above-mentioned patent application is hereby incorporated by reference herein and made a part of this specification.

BACKGROUND OF THE INVENTION

1. Field of the Invention

The invention relates to a piezoelectric device capable of accommodating a piezoelectric oscillating plate of different sizes.

2. Description of the Related Art

It is known that a piezoelectric oscillating plate is oscillated by applying a voltage to an excitation electrode. Such a piezoelectric oscillating plate, for example, is disposed in a ceramic package, and a piezoelectric device is formed by connecting a connection electrode formed in the ceramic package with an extraction electrode extracted from the excitation electrode. The piezoelectric oscillating plate may have different sizes due to its oscillation frequency. When disposing piezoelectric oscillating plates of different sizes respectively into the ceramic package that has a fixed size, the excitation electrode and the connection electrode of the large-size piezoelectric oscillating plate may cause a short circuit. In addition, the piezoelectric oscillating plate has to be large enough in size to allow an electrical connection between the extraction electrode and the connection electrode. Consequently, a narrow size range of the piezoelectric oscillating plate is acceptable. Therefore, when using piezoelectric oscillating plates of different sizes, the size of the ceramic package or the connection electrode formed in the ceramic package for connecting the extraction electrode of the piezoelectric oscillating plate has to be modified to match with the sizes of the piezoelectric oscillating plates.

On one hand, Patent Reference 1 has disclosed a piezoelectric device capable of accommodating a crystal oscillating plate of different sizes with a ceramic package having a fixed size. According to Patent Reference 1, the crystal oscillating plate of different sizes can be stably disposed in the ceramic package by using auxiliary support plates to support the crystal oscillating plate.

RELATED ART

Patent Reference

[Patent Reference 1] JP 2005-260727

Problem to be Solved by the Invention

However, the method utilizing auxiliary support plates increases the cost due to the utilization of new components and the installation of the auxiliary support plates is both time and effort consuming.

SUMMARY OF THE INVENTION

Accordingly, the invention provides a piezoelectric device, which is capable of accommodating a piezoelectric oscillating plate of different sizes through the adjustment of a shape and a formation position of a connection electrode.

Solution to the Problem

According to the first aspect of the invention, the invention provides a piezoelectric device includes a first piezoelectric oscillating plate or a second piezoelectric oscillating plate. The first piezoelectric oscillating plate has a first length in a predetermined direction and includes a pair of excitation electrodes and a pair of extraction electrodes, which respectively extend from the excitation electrodes toward a side and an opposite side of the first piezoelectric oscillating plate. The second piezoelectric oscillating plate has a second length shorter than the first length in the predetermined direction and includes a pair of excitation electrodes and a pair of extraction electrodes, which respectively extend from the excitation electrodes toward a side and an opposite side of the second piezoelectric oscillating plate. The extraction electrodes are electrically connected with connection electrodes disposed in a package in the predetermined direction on two sides via an electrically-conductive adhesive agent. Furthermore, the package includes carrier sections for carrying the first or the second piezoelectric oscillating plate thereon, and the connection electrodes are formed on at least a portion of a surface of the carrier sections. When the extraction electrodes of the first piezoelectric oscillating plate are electrically connected with the connection electrodes, the excitation electrode on one side of the first piezoelectric oscillating plate is not electrically connected with the connection electrode that connects with the extraction electrode extending from the excitation electrode on the other side of the first piezoelectric oscillating plate; and the extraction electrodes of the second piezoelectric oscillating plate can be electrically connected with the connection electrodes.

According to the second aspect of the invention, which is based on the piezoelectric device of the first aspect, the second piezoelectric oscillating plate is not disposed on the connection electrodes, and the electrically-conductive adhesive agent is extended to electrically connect with the connection electrodes with the extraction electrodes.

According to the third aspect, based on the piezoelectric device of the first aspect, the carrier sections include a second carrier section and a first carrier section that is formed on the second carrier section. The connection electrodes include a first connection electrode formed on the first carrier section and a second connection electrode formed on the second carrier section. The first connection electrode is electrically connected with the extraction electrodes of the first piezoelectric oscillating plate; and the second connection electrode is electrically connected with the extraction electrodes of the second piezoelectric oscillating plate.

According to the fourth aspect, based on the piezoelectric device of the first aspect, the carrier sections include a second carrier section and a first carrier section that is formed on the second carrier section. The connection electrodes include a first connection electrode formed on the first carrier section and a second connection electrode formed on the second carrier section. The extraction electrodes of the first piezoelectric oscillating plate are electrically connected with the first connection electrode. The extraction electrode that extends to one side of the second piezoelectric oscillating plate is electrically connected with the first connection electrode, while the extraction electrode that extends to the other side of the second piezoelectric oscillating plate is electrically connected with the second connection electrode.

According to the fifth aspect of the invention, based on the piezoelectric device of the third or the fourth aspect, the second connection electrode forms an end section that is closer to an inside of the package than the first connection electrode in the predetermined direction.

According to the invention, a piezoelectric device can be provided to accommodate a piezoelectric oscillating plate of different sizes through the adjustment of a shape and a position of the connection electrode.

DESCRIPTION OF THE EMBODIMENTS

Exemplary embodiments of the invention are described in detail below with reference to the drawings. The scope of the invention, however, should not be limited by the descriptions of these embodiments unless otherwise specified.

First Embodiment

Structure of Piezoelectric Device 100

Figure 1:
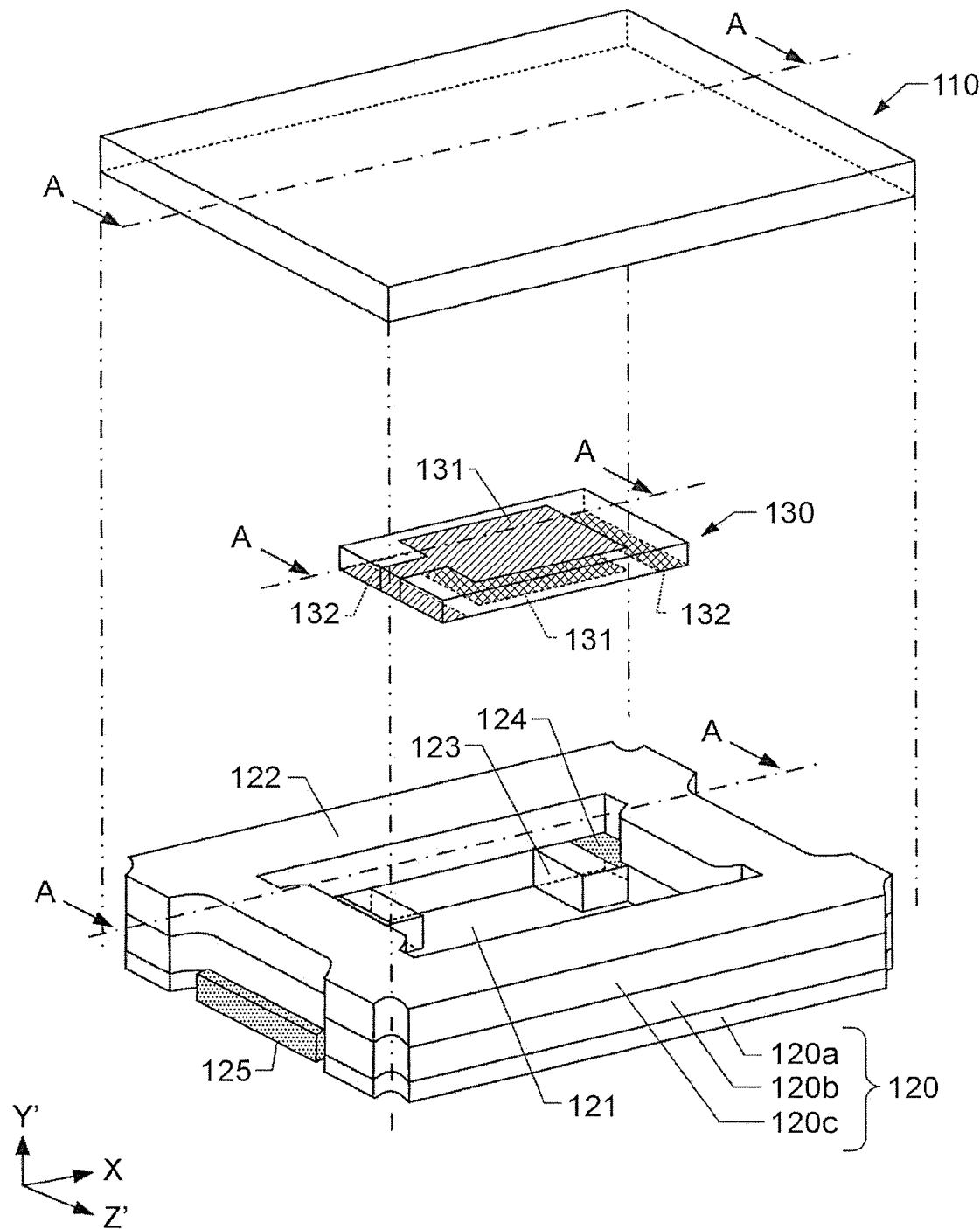
FIG. 1 is an explosive perspective view of a piezoelectric device 100.

FIG. 1 is an explosive perspective view of a piezoelectric device 100. The piezoelectric device 100 includes a piezoelectric oscillating plate 130, a lid 110, and a package 120. An AT-cut crystal oscillating plate, for example, is used as the piezoelectric oscillating plate 130. Relative to a Y axis of a crystal axis (XYZ), a principal surface (YZ plane) of the AT-cut crystal oscillating plate is inclined by 35°15' from a Z axis toward a Y-axis direction with an X axis as the center. In the following descriptions, the axis directions of the AT-cut crystal oscillating plate are taken as a reference, and the inclined new axes are respectively defined as a Y' axis and a Z' axis. Namely, in the piezoelectric device 100, a longitudinal direction of the piezoelectric device 100 is described as an X-axis direction, a height direction thereof is described as a Y'-axis direction, and a direction perpendicular to the X-axis direction and the Y'-axis direction is described as a Z'-axis direction.

In the piezoelectric device 100, the piezoelectric oscillating plate 130 is disposed in a concave 121 that is formed in the package 120 at the +Y'-axis side. Moreover, the lid 110 is bonded to a surface of the package 120 at the +Y'-axis side in a way to seal the concave 121 where the piezoelectric oscillating plate 130 is disposed, so as to form the piezoelectric device 100.

Excitation electrodes 131 are respectively disposed on principal surfaces of the piezoelectric oscillating plate 130 at the +Y'-axis side and the −Y'-axis side. Moreover, extraction electrodes 132 are respectively formed on two ends of the piezoelectric oscillating plate 130 in the X-axis direction in a manner to extend from each of the excitation electrodes 131. The extraction electrode 132, which is electrically connected with the excitation electrode 131 formed on the principal surface of the piezoelectric oscillating plate 130 at the −Y'-axis side, is extended to an end at the +X-axis side on the surface of the piezoelectric oscillating plate 130 at the −Y'-axis side. Further, the extraction electrode 132, which is electrically connected with the excitation electrode 131 formed on the principal surface at the +Y'-axis side, is extended to an end at the −X-axis side on the surface of the piezoelectric oscillating plate 130 at the −Y'-axis side. Each of the extraction electrodes 132 formed at two ends of the piezoelectric oscillating plate 130 in the X-axis direction is extended from an end at the +Z'-axis side of the piezoelectric oscillating plate 130 to an end at the −Z'-axis side. The electrodes, i.e. excitation electrodes 131 and extraction electrodes 132, formed on the piezoelectric oscillating plate 130 are formed by forming a Cr layer on the piezoelectric oscillating plate 130 and forming an Au layer on the Cr layer, for example.

A concave 121 is formed on the surface of the package 120 at the +Y'-axis side. Carrier sections 123 for carrying the piezoelectric oscillating plate 130 thereon are formed in the concave 121, and connection electrodes 124 are formed on the carrier sections 123. A bonding surface 122 is formed around the concave 121 of the package 120 for bonding to the lid 110. Moreover, a pair of external electrodes 125 (see FIG. 2A) is formed on a surface of the package 120 at the −Y'-axis side. The connection electrodes 124 and the external electrodes 125 are electrically connected with each other by through electrodes 126 (see FIG. 2A) that pass through the package 120. The package 120 is formed by ceramics, for example, and includes three layers. A first layer 120a is formed into a planar shape and disposed at the −Y'-axis side of the package 120. The external electrodes 125 are formed on a surface of the first layer 120a at the −Y'-axis side. A second layer 120b is disposed on a surface of the first layer 120a at the +Y'-axis side. A through hole is formed in a central section of the second layer 120b to form a part of the concave 121. Moreover, in the second layer 120b, the carrier sections 123 are formed in the concave 121, and the connection electrodes 124 are formed on the carrier sections 123. A third layer 120c is further disposed on a surface of the second layer 120b at the +Y'-axis side. A through hole is formed in a central section of the third layer 120c to form a part of the concave 121. In addition, the bonding surface 122 is formed on a surface of the third layer 120c at the +Y'-axis side. The connection electrodes 124, external electrodes 125, and through electrodes 126 of the package 120 are formed by, for example, forming a tungsten layer on ceramics, then forming a nickel layer as a base layer on the tungsten layer, and forming a gold layer as a finish plating layer on the nickel layer.

The lid 110 is formed into a planar plate. The lid 110 is bonded to the bonding surface 122 formed on the surface of the package 120 at the +Y'-axis side by a sealant material 142, so as to seal the concave 121 of the package 120.

The piezoelectric oscillating plate 130 of various sizes can be disposed in the package 120. The following paragraphs describe the examples that a first piezoelectric oscillating plate 130A, which has a large size, and a second piezoelectric oscillating plate 130B, which has a small size, are respectively used in the piezoelectric device 100.

<Piezoelectric Device 100 Applying First Piezoelectric Oscillating Plate 130A>

Figure 2A:
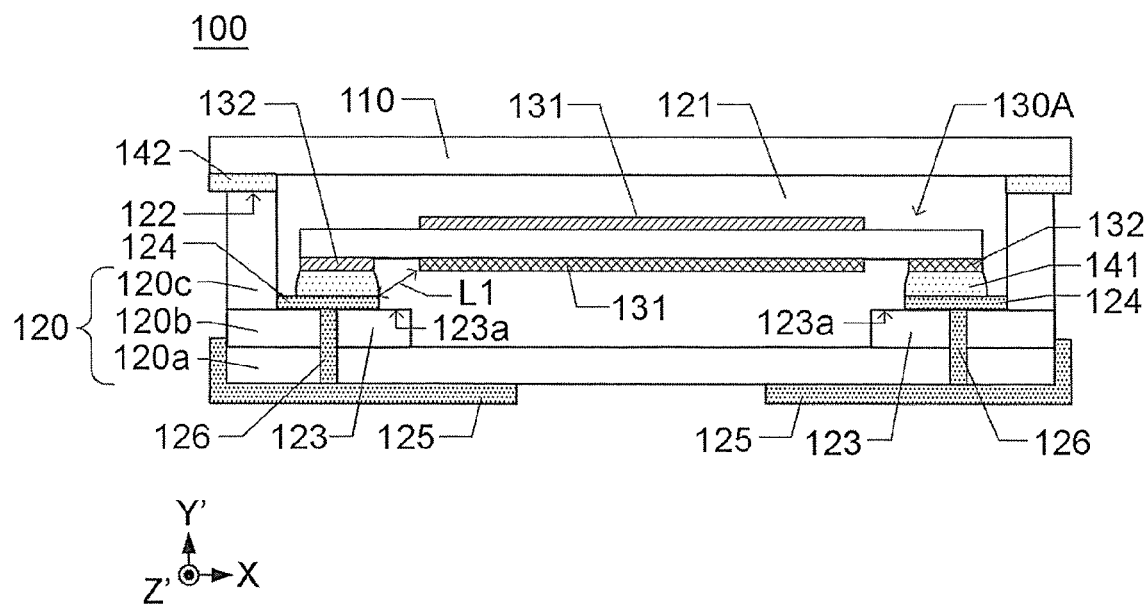
FIG. 2A is a cross-sectional view of the piezoelectric device 100, in which a first piezoelectric oscillating plate 130A is used.

FIG. 2A is a cross-sectional view of the piezoelectric device 100, in which the first piezoelectric oscillating plate 130A is used. FIG. 2A is a cross-sectional view along the line A-A in FIG. 1 and along the line A-A in FIG. 2B described below. The carrier sections 123 are respectively formed in the concave 121 of the package 120 at the +X-axis side and the −X-axis side, and the connection electrodes 124 are respectively formed on the +X-axis side and the −X-axis side of the +Y'-axis surfaces of the carrier sections 123 at the +X-axis side and the −X-axis side. The connection electrodes 124 are electrically connected with the external electrodes 125 via the through electrodes 126 that pass through the package 120. Further, the first piezoelectric oscillating plate 130A is disposed on the carrier sections 123, and the extraction electrodes 132 and the connection electrodes 124 are electrically connected with each other by an electrically-conductive adhesive agent 141. Areas 123a, on which no connection electrode 124 is formed, are respectively formed on the −X-axis side of the carrier section 123 that is formed at the +X-axis side of the piezoelectric device 100 and on the +X-axis side of the carrier section 123 that is formed at the −X-axis side of the piezoelectric device 100. Herein, by forming the areas 123a, where connection electrodes 124 are not formed thereon, on the carrier sections 123, a shortest distance L1 between the connection electrodes 124 at the −X-axis side and the excitation electrode 131 formed on the first piezoelectric oscillating plate 130A at the −Y'-axis side is sufficient to keep the connection electrodes 124 at the −X-axis side and the excitation electrode 131 formed on the first piezoelectric oscillating plate at the −Y'-axis side from contacting each other. By bonding the lid 110, which is disposed on the +Y'-axis side of the package 120, to the bonding surface 122 of the package 120 through the sealant material 142, the concave 121 of the package 120 is sealed.

Figure 2B:
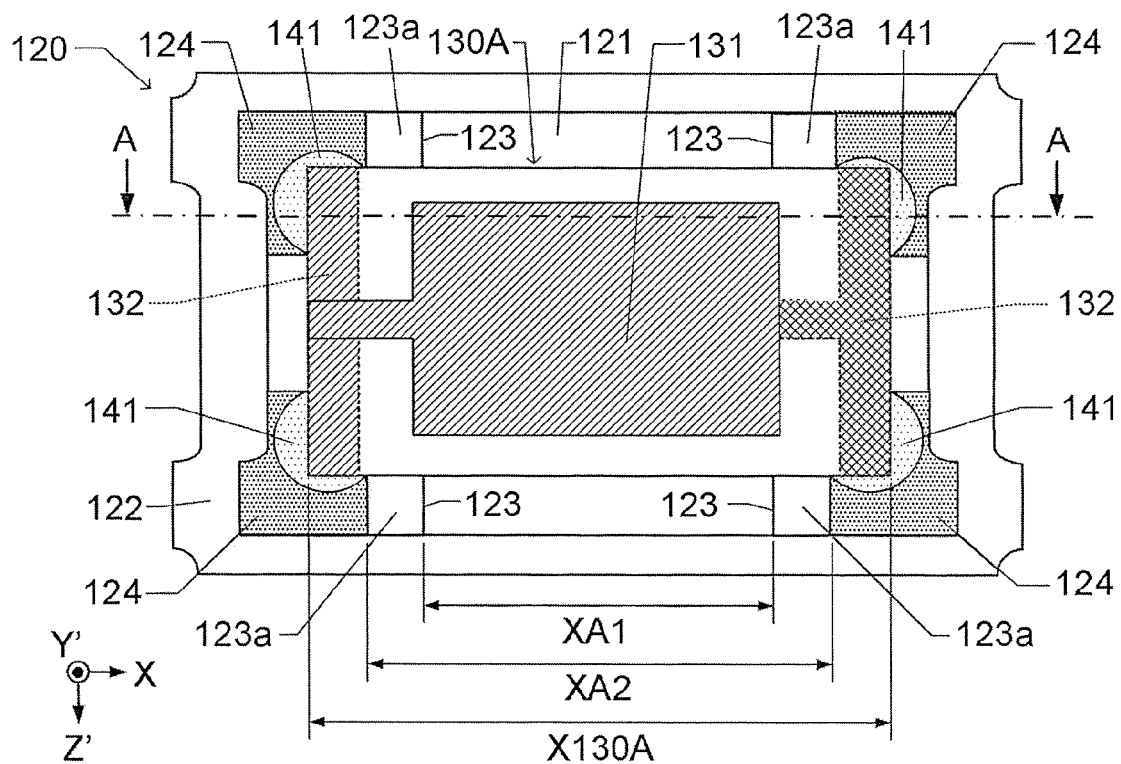
FIG. 2B is a plane view of a package 120, in which the first piezoelectric oscillating plate 130A is disposed.

FIG. 2B is a plane view of the package 120, in which the first piezoelectric oscillating plate 130A is disposed. The carrier sections 123 are formed at four corners of the concave 121 of the package 120. The connection electrode 124 and the area 123a, where no connection electrode 124 is formed, are respectively formed on a top of each of the carrier sections 123. If the distance between the carrier sections 123 formed at the −X-axis side and the +X-axis side is defined as XA1, the distance between the connection electrodes 124 formed at the +X-axis side and the −X-axis side is defined as XA2, and a length of the first piezoelectric oscillating plate 130A in the X-axis direction is defined as a first length X130A, then the first length X130A of the first piezoelectric oscillating plate 130A is longer than the distance XA2, and the distance XA2 is longer than the distance XA1.

<Piezoelectric Device 100 Applying Second Piezoelectric Oscillating Plate 130B>

Figure 3A:
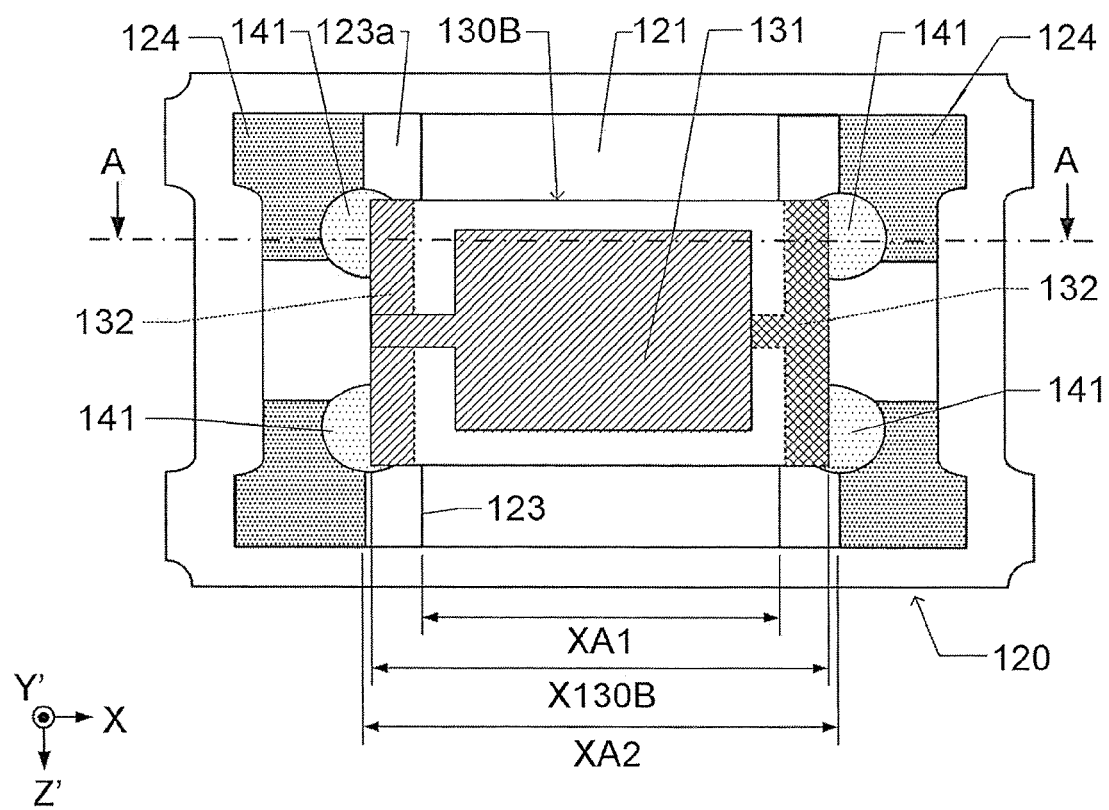
FIG. 3A is a plane view of the package 120, in which a second piezoelectric oscillating plate 130B is disposed.

FIG. 3A is a plane view of the package 120, in which the second piezoelectric oscillating plate 130B is disposed. If a length of the second piezoelectric oscillating plate 130B in the X-axis direction is defined as a second length X130B, the second length X130B is longer than the distance XA1 and shorter than the distance XA2. That is to say, the second piezoelectric oscillating plate 130B is disposed on the areas 123a of the carrier sections 123 where the connection electrode 124 is not formed. In addition, the extraction electrodes 132 of the second piezoelectric oscillating plate 130B are electrically connected with the connection electrodes 124 via the electrically-conductive adhesive agent 141.

Figure 3B:
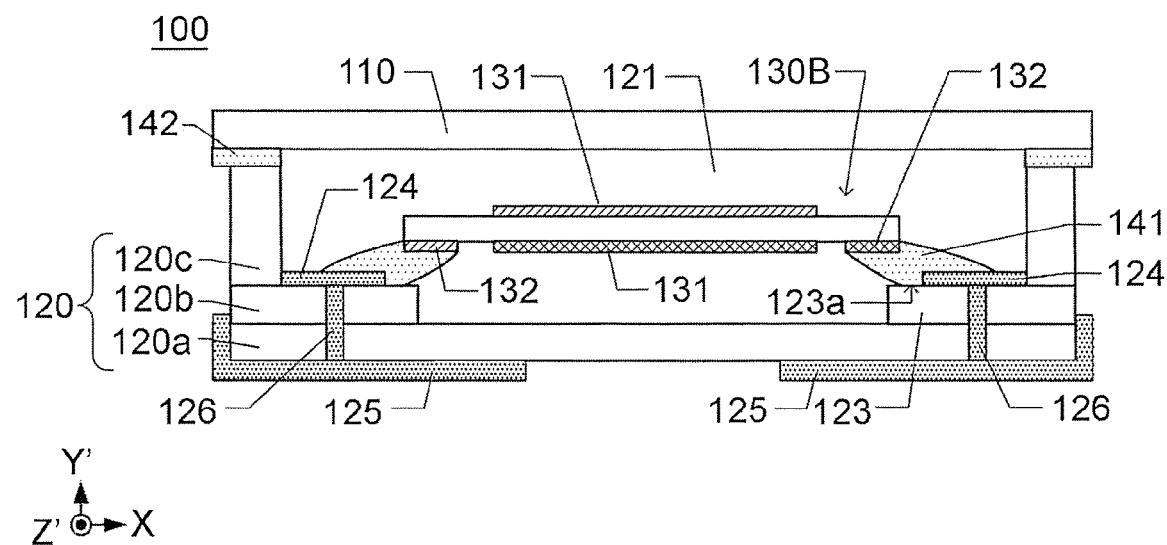
FIG. 3B is a cross-sectional view of the piezoelectric device 100, in which the second piezoelectric oscillating plate 130B is used.

FIG. 3B is a cross-sectional view of the piezoelectric device 100, in which the second piezoelectric oscillating plate 130B is used. FIG. 3B is a cross-section along the line A-A in FIG. 1 and FIG. 3A. The extraction electrodes 132 of the second piezoelectric oscillating plate 130B do not overlap with the connection electrodes 124 in the Y'-axis direction. Therefore, the electrically-conductive adhesive agent 141, which fixes the second piezoelectric oscillating plate 130B on the carrier sections 123 and electrically connects the connection electrodes 124 with the extraction electrodes 132, is extended from the connection electrodes 124 to the extraction electrodes 132. Because the electrically-conductive adhesive agent 141 is also formed on the areas 123a, the second piezoelectric oscillating plate 130B is firmly bonded onto the carrier sections 123.

In the conventional piezoelectric device, when a piezoelectric oscillating plate having a long length in the X-axis direction is disposed in a package, an excitation electrode formed at the −Y'-axis side may contact and be electrically connected with a connection electrode that connects with an extraction electrode extended from an excitation electrode formed at the +Y'-axis side. In the piezoelectric device 100 where the first piezoelectric oscillating plate 130A having a long length in the X-axis direction is disposed, by forming the areas 123a, on which no connection electrode 124 is formed, on the carrier sections 123, the shortest distance L1 between the excitation electrode 131 at the −Y'-axis side and the connection electrodes 124 that connect with the extraction electrode 132 extended from the excitation electrode 131 formed at the +Y'-axis side is sufficient to prevent the excitation electrode 131 at the −Y'-axis side and the connection electrodes 124 at the −X-axis side from contacting each other. Therefore, even though the first piezoelectric oscillating plate 130A that has the long length in the X-axis direction is disposed, the excitation electrode 131 at the −Y'-axis side and the connection electrodes 124 at the −X-axis side can be kept from contacting and electrically connecting with each other (see FIG. 2A). Furthermore, in the piezoelectric device 100 in which the second piezoelectric oscillating plate 130B having the short length in the X-axis direction is disposed, the pair of extraction electrodes 132 of the second piezoelectric oscillating plate 130B can be electrically connected with the connection electrodes 124 by extending the electrically-conductive adhesive agent 141 (see FIG. 3B).

Second Embodiment

In the piezoelectric device 100, the first piezoelectric oscillating plate 130A having the long length in the X-axis direction, and the second piezoelectric oscillating plate 130B having the short length in the X-axis direction can be disposed on a set of the connection electrodes 124. On the other hand, two types of connection electrodes respectively for carrying the long first piezoelectric oscillating plate and the short second piezoelectric oscillating plate can be formed in the package. The following paragraphs describe a package 220 and a piezoelectric device 200 including the package 220 and a package 320 and a piezoelectric device 300 including the package 320, and two types of connection electrodes are formed in the package 220 and the package 320. In the second embodiment, elements the same as those in the first embodiment are depicted by the same reference numerals, and thus detailed descriptions thereof are omitted hereinafter.

<Structure of Package 220>

Figure 4A:
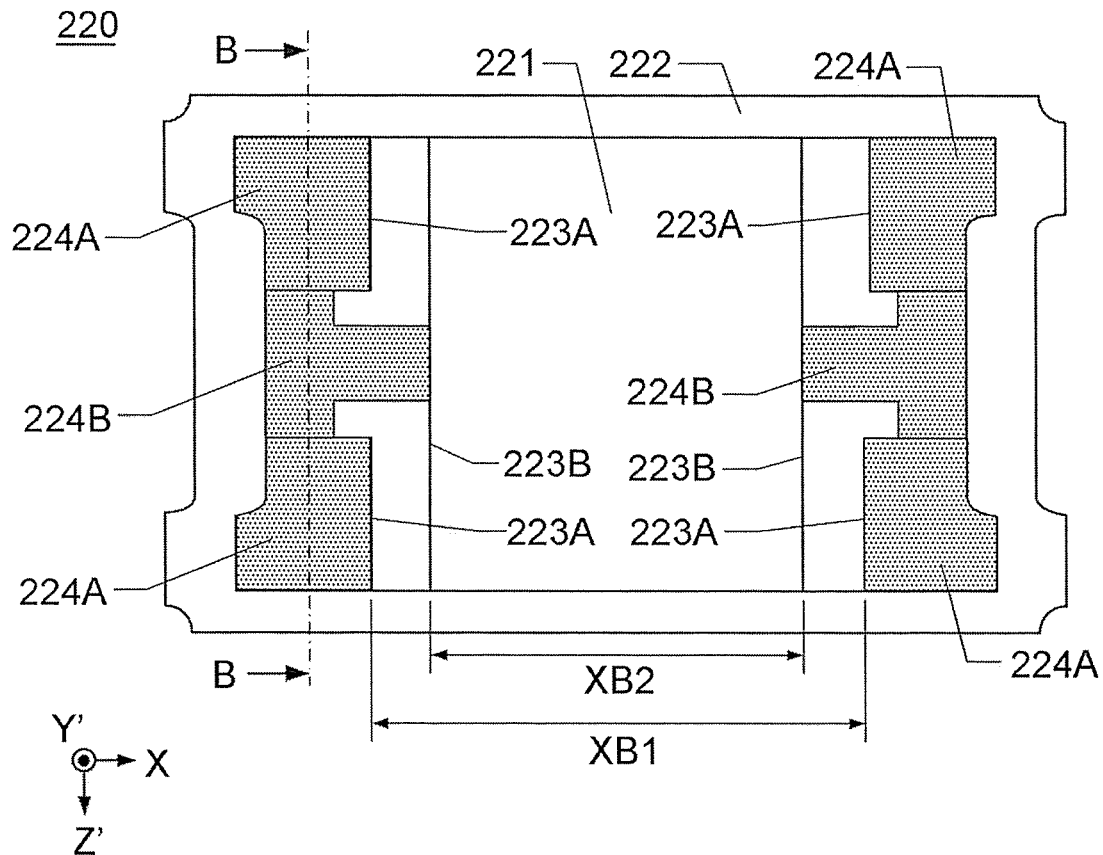
FIG. 4A is a plane view of a package 220.

FIG. 4A is a plane view of the package 220. In the package 220, a concave 221 is formed on a surface of the package 220 at the +Y'-axis side, and second carrier sections 223B and first carrier sections 223A disposed on the second carrier sections 223B are formed in the concave 221. The second carrier sections 223B are respectively formed on the +X-axis side and the −X-axis side of the concave 221, and the first carrier sections 223A are respectively formed at positions equivalent to four corners of the concave 221 and on surfaces of the second carrier sections 223B at the +Y'-axis side. First connection electrodes 224A are respectively disposed on the first carrier sections 223A, and second connection electrodes 224B are respectively disposed on the second carrier sections 223B. A distance between the first carrier sections 223A formed at the −X-axis side and the +X-axis side is defined as XB1, and a distance between the second carrier sections 223B formed at the −X-axis side and the +X-axis side is defined as XB2. Moreover, in the package 220, the distance XB1 is a distance between the first connection electrodes 224A formed at the −X-axis side and the +X-axis side, and the distance XB2 is a distance between the second connection electrodes 224B formed at the −X-axis side and the +X-axis side. Herein, the distance XB1 is longer than the distance XB2.

Figure 4B:
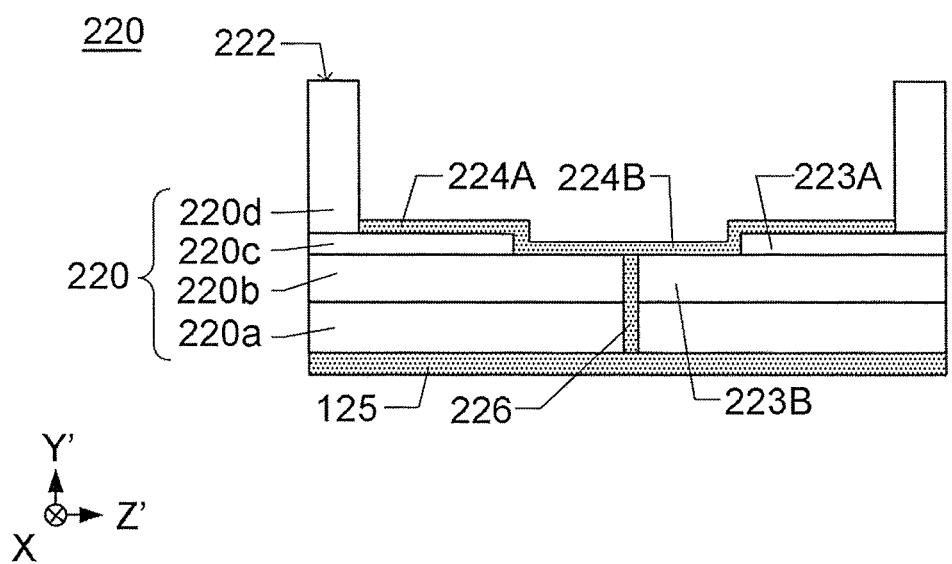
FIG. 4B is a cross-section along line B-B in FIG. 4A.

FIG. 4B is a cross-sectional view along the line B-B in FIG. 4A. The package 220 is formed by four layers. A first layer 220a is formed into a planar shape and disposed at the −Y'-axis side of the package 220. The external electrodes 125 are formed on a surface of the first layer 220a at the −Y'-axis side. A second layer 220b is disposed on the +Y'-axis side of the first layer 220a. A through hole (not shown) is formed in a central section of the second layer 220b to constitute a part of the concave 221. In addition, the second layer 220b forms the second carrier sections 223B (see FIG. 4A), and the second connection electrodes 224B are formed on the second carrier sections 223B. A third layer 220c is disposed on the second layer 220b. A through hole (not shown) is formed in a central section of the third layer 220c to constitute a part of the concave 221. The third layer 220c forms the first carrier sections 223A, and the first connection electrodes 224A are formed on the first carrier sections 223A. A fourth layer 220d is disposed on the third layer 220c. A bonding surface 222 is formed on a surface of the fourth layer 220d at the +Y'-axis side. Because the first connection electrodes 224A are formed on the third layer 220c and the second connection electrodes 224B are formed on the second layer 220b, the first connection electrodes 224A are formed higher than the second connection electrodes 224B in the +Y'-axis direction by a thickness of the third layer 220c. Moreover, the first connection electrodes 224A and the second connection electrodes 224B are electrically connected, and the second connection electrodes 224B are electrically connected with the external electrodes 125 via the through electrode 226 that passes through the package 220.

The piezoelectric oscillating plate 130 disposed in the package 220 may have various sizes. The following paragraphs describe the examples that a first piezoelectric oscillating plate 130A of a large size, and a second piezoelectric oscillating plate 130B of a small size, are respectively used in the piezoelectric device 200.

<Piezoelectric Device 200 Applying First Piezoelectric Oscillating Plate 130A>

Figure 5A:
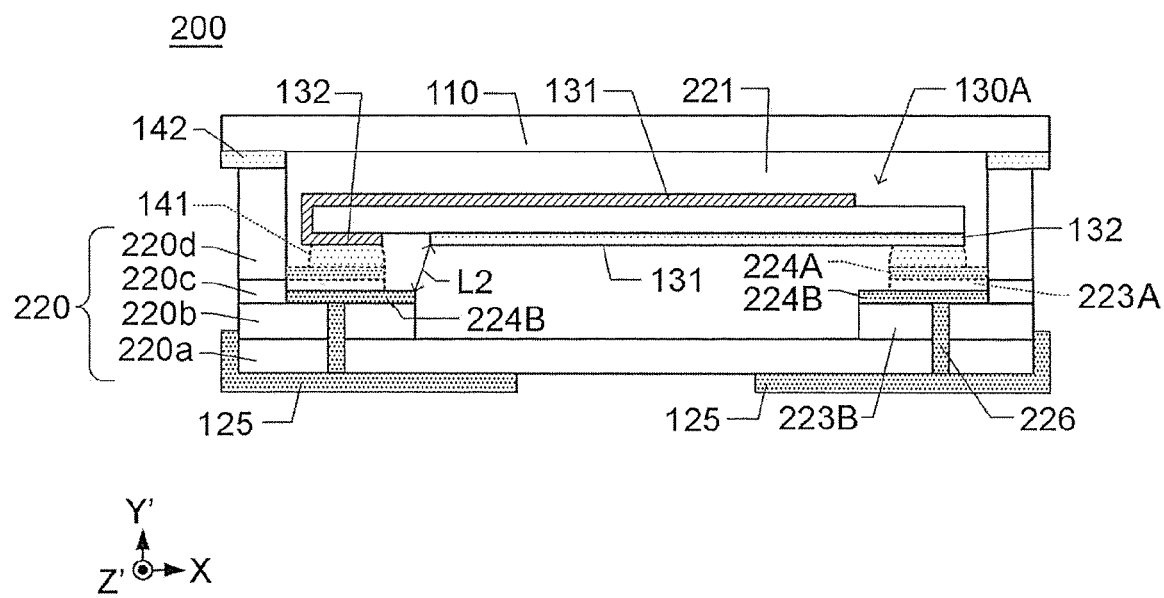
FIG. 5A is a cross-sectional view of a piezoelectric device 200, in which the first piezoelectric oscillating plate 130A is used.

FIG. 5A is a cross-sectional view of the piezoelectric device 200, in which the first piezoelectric oscillating plate 130A is used. FIG. 5A is a cross-sectional view along the line C-C in FIG. 5B as described below. The piezoelectric device 200 as illustrated in FIG. 5A includes the package 220, the lid 110, and the first piezoelectric oscillating plate 130A. The extraction electrodes 132 formed on the first piezoelectric oscillating plate 130A are electrically connected with the first connection electrodes 224A by the electrically-conductive adhesive agent 141. Herein, by forming the first carrier sections 223A, which is separated from the second carrier sections 223B on the +Y'-axis side by the thickness of the third layer 220c, the shortest distance L2 between the second connection electrode 224B formed at the −X-axis side and the excitation electrode 131 formed on a surface of the first piezoelectric oscillating plate 130A at the −Y'-axis side is sufficient for keeping the second connection electrode 224B at the −X-axis side from contacting the excitation electrode 131 at the −Y'-axis side.

Figure 5B:
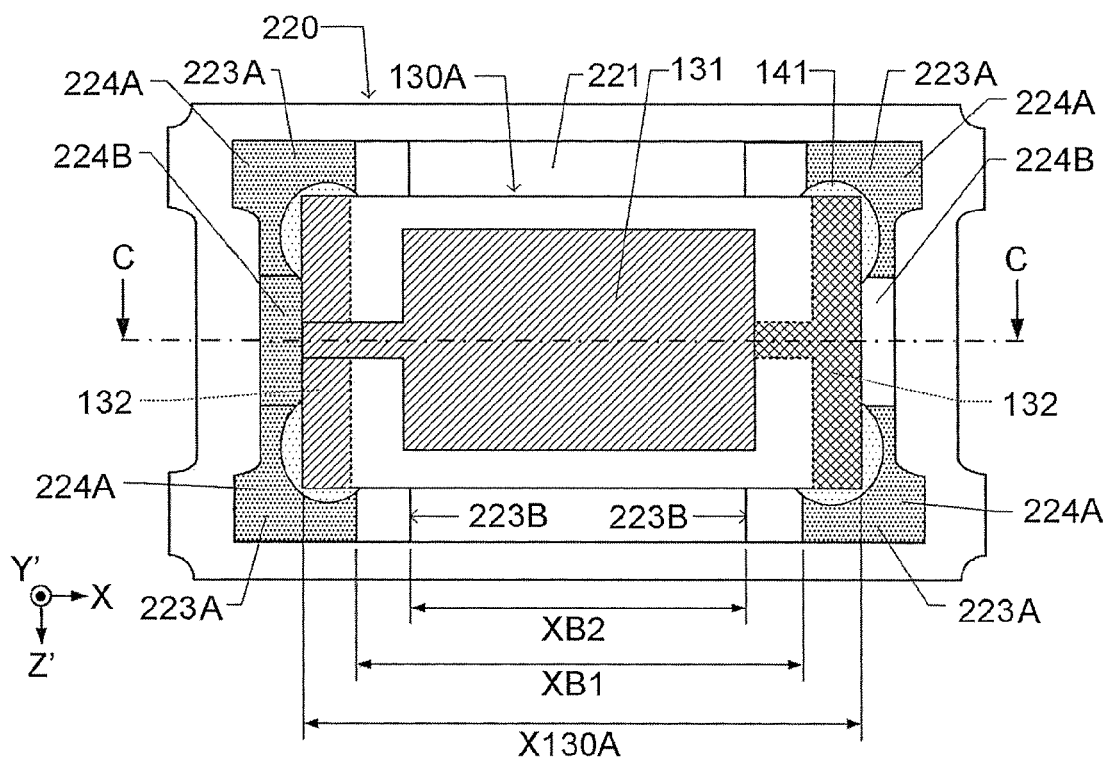
FIG. 5B is a plane view of the package 220, in which the first piezoelectric oscillating plate 130A is disposed.

FIG. 5B is a plane view of the package 220, in which the first piezoelectric oscillating plate 130A is disposed. The first length X130A of the first piezoelectric oscillating plate 130A is longer than the distance XB1 and the distance XB2. Therefore, the first piezoelectric oscillating plate 130A can be disposed on the first carrier sections 223A. In addition, the first connection electrodes 224A and the extraction electrodes 132 are electrically connected by the electrically-conductive adhesive agent 141.

<Piezoelectric Device 200 Applying Second Piezoelectric Oscillating Plate 130B>

Figure 6A:
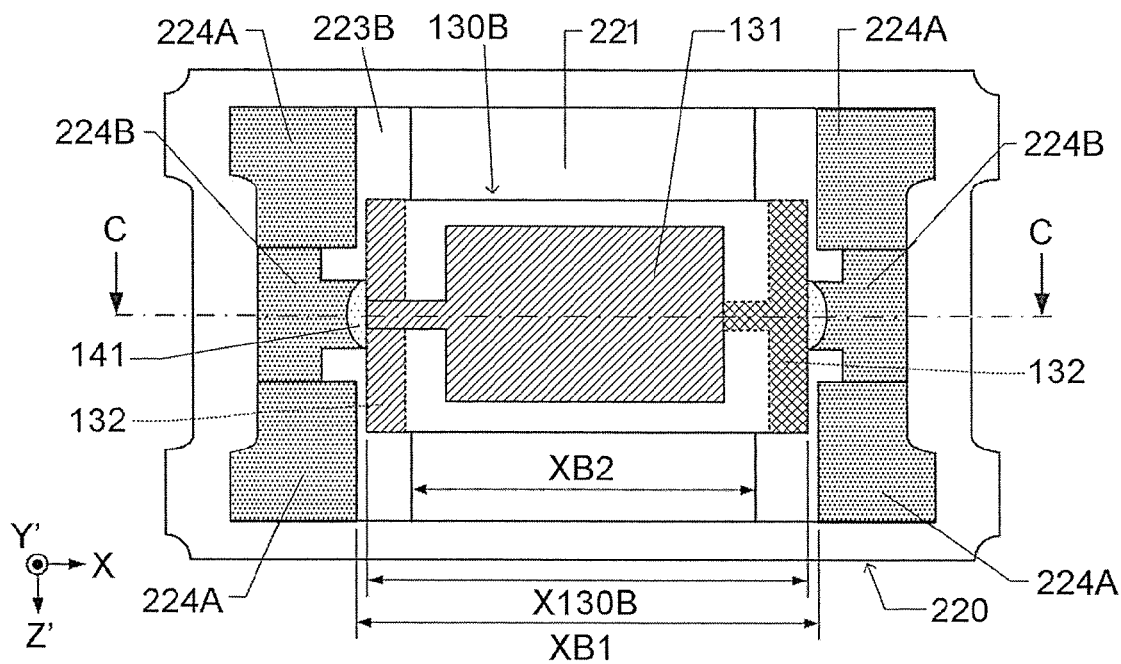
FIG. 6A is a plane view of the package 220, in which the second piezoelectric oscillating plate 130B is disposed.

FIG. 6A is a plane view of the package 220, in which the second piezoelectric oscillating plate 130B is disposed. The second length X130B of the second piezoelectric oscillating plate 130B is longer than the distance XB2 between the second carrier sections 223B formed at the −X-axis side and the +X-axis side, and shorter than the distance XB1 between the first connection electrodes 224A formed at the −X-axis side and the +X-axis side. That is, the second piezoelectric oscillating plate 130B can be disposed on the second carrier sections 223B, and the extraction electrodes 132 of the second piezoelectric oscillating plate 130B are connected with the second connection electrodes 224B via the electrically-conductive adhesive agent 141.

Figure 6B:
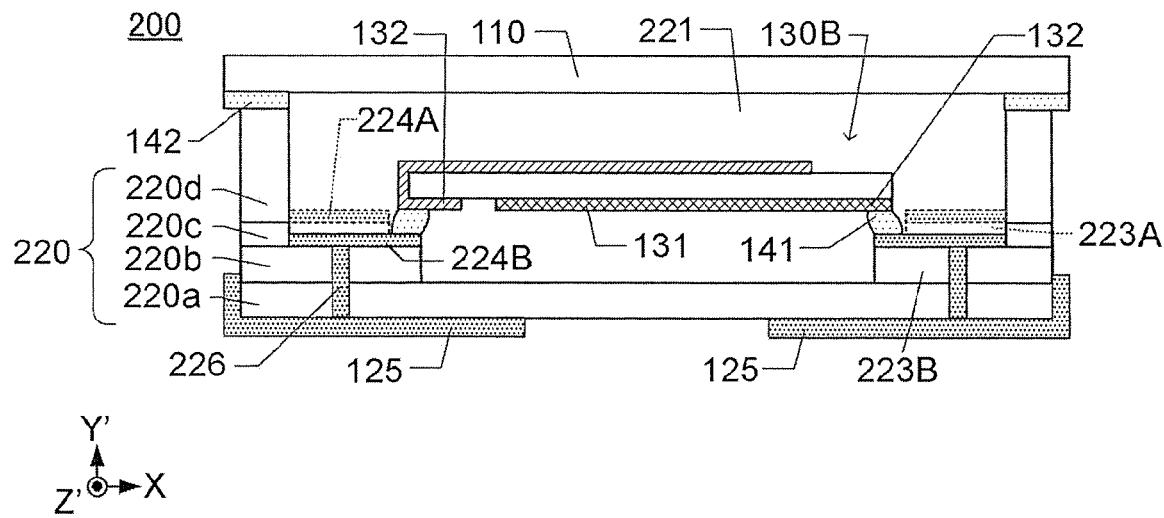
FIG. 6B is a cross-sectional view of the piezoelectric device 200, in which the second piezoelectric oscillating plate 130B is used.

FIG. 6B is a cross-sectional view of the piezoelectric device 200, in which the second piezoelectric oscillating plate 130B is used. FIG. 6B is equivalent to a cross-section along the line C-C in FIG. 6A. The second piezoelectric oscillating plate 130B is disposed on the second carrier sections 223B, and the extraction electrodes 132 are electrically connected with the second connection electrodes 224B via the electrically-conductive adhesive agent 141.

In the piezoelectric device 200 where the first piezoelectric oscillating plate 130A is disposed therein, by forming the first carrier sections 223A, which is separated from the second carrier sections 223B by the thickness of the third layer 220c in the +Y'-axis side, the shortest distance L2 between the second connection electrode 224B formed at the −X-axis side and the excitation electrode 131 formed on the −Y'-axis side of the first piezoelectric oscillating plate 130A is sufficient to keep the excitation electrode 131 on the −Y'-axis side and the second connection electrode 224B from contacting each other. For this reason, even though the first piezoelectric oscillating plate 130A is disposed, the excitation electrode 131 at the −Y'-axis side and the second connection electrode 224B at the −X-axis side do not contact nor electrically connect with each other (see FIG. 5A). Furthermore, in the piezoelectric device 200 where the second piezoelectric oscillating plate 130B with a shorter length in the X-axis direction is disposed therein, the extraction electrodes 132 and the second connection electrodes 224B can be electrically connected (see FIGS. 6A and 6B) by connecting the extraction electrodes 132 with the second connection electrodes 224B through the electrically-conductive adhesive agent 141.

<Structure of Package 320>

Figure 7A:
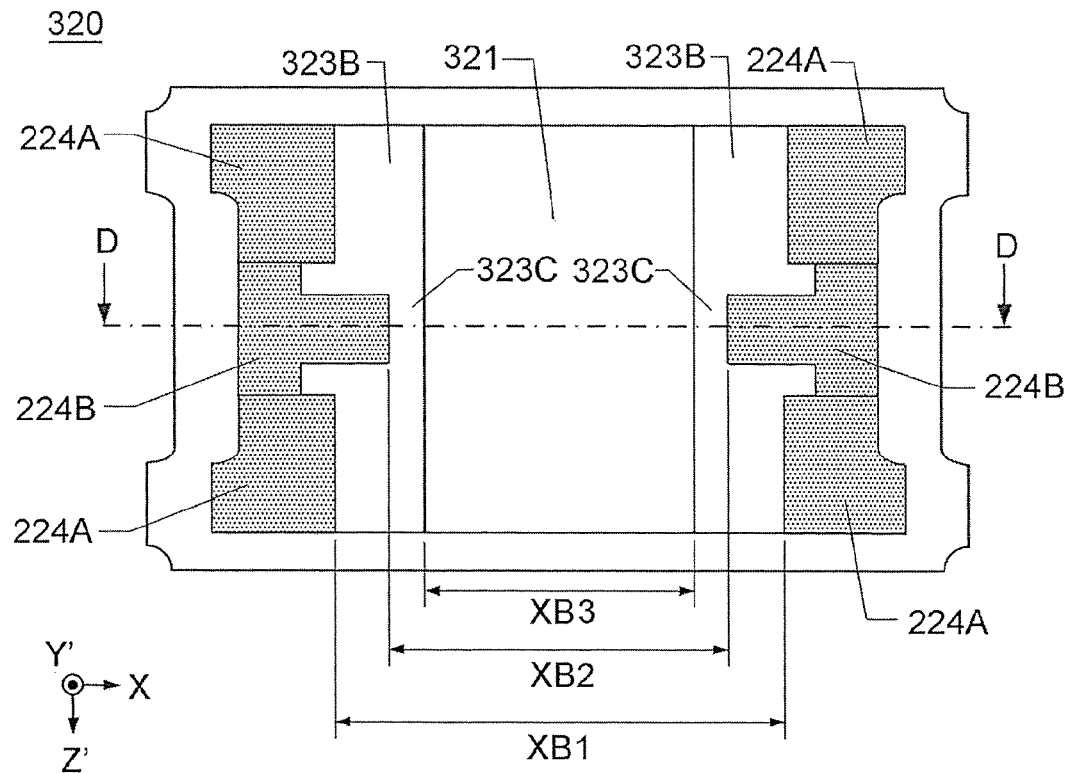
FIG. 7A is a plane view of a package 320.

FIG. 7A is a plane view of the package 320. A distance between the second carrier sections formed at the −X-axis side and the +X-axis side in the package 320 is different from that in the package 220 shown in FIG. 4A. In the package 320, the distance XB3 between the second carrier sections 323B formed at the −X-axis side and the +X-axis side is shorter than the distance XB2. In addition, the distance between the second connection electrodes 224B formed on the second carrier sections 323B is the same as the distance XB2 in the package 220. Therefore, areas 323C, where no second connection electrode 224B is formed, respectively exist on the −X-axis side of the second carrier section 323B formed at the +X-axis side and on the +X-axis side of the second carrier section 323B formed at the −X-axis side.

<Piezoelectric Device 300 Applying Third Piezoelectric Oscillating Plate 130C>

Figure 7B:
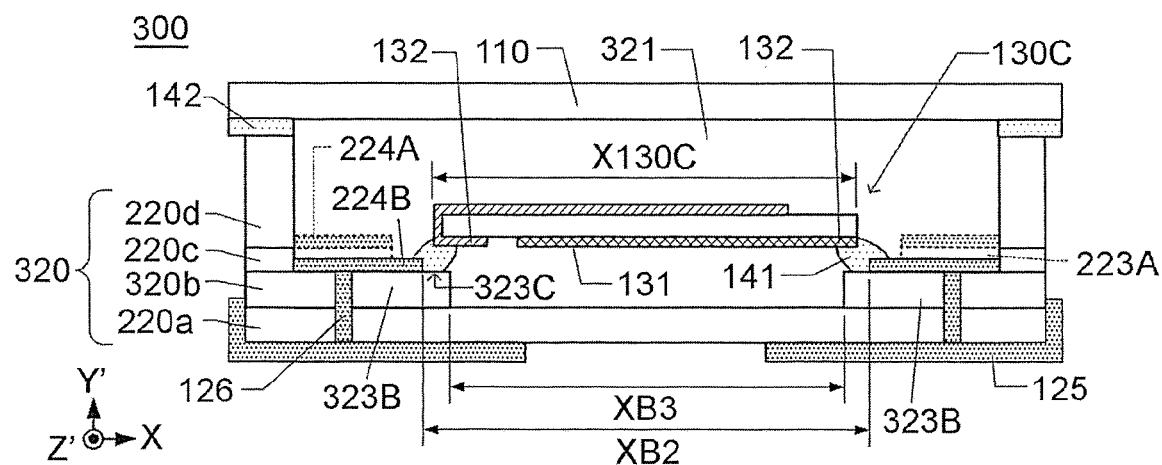
FIG. 7B is a cross-sectional view of a piezoelectric device 300, in which a third piezoelectric oscillating plate 130C is used.

FIG. 7B is a cross-sectional view of a piezoelectric device 300, in which a third piezoelectric oscillating plate 130C is used. FIG. 7B is a cross-sectional view along the line D-D in FIG. 7A. The piezoelectric device 300 includes the package 320, which is formed by the first layer 220a, the second layer 320b, the third layer 220c and the fourth layer 220d. The second layer 320b forms the second carrier sections 323B. The lid 110 is bonded to the package 320 with the sealant material 142 in a way to seal a concave 321 formed in the package 320 at the +Y'-axis side. In the concave 321 of the package 320, the third piezoelectric oscillating plate 130C is disposed on the second carrier sections 323B. The length X130C of the third piezoelectric oscillating plate 130C in the X-axis direction is shorter than the second length X130B of the second piezoelectric oscillating plate 130B and shorter than the distance XB2 of the package 320, and the length X130C is longer than the distance XB3. Namely, the same as the second piezoelectric oscillating plate 130B shown in FIGS. 3A and 3B, the third piezoelectric oscillating plate 130C is also disposed on the areas 323C of the second carrier sections 323B, on which no second connection electrode 224B is formed, and fixed on the second carrier sections 323B via the electrically-conductive adhesive agent 141. And, the extraction electrodes 132 of the third piezoelectric oscillating plate 130C and the second connection electrodes 224B are electrically connected with each other by extending the electrically-conductive adhesive agent 141.

The same as the piezoelectric device 200, when the first piezoelectric oscillating plate 130A is disposed in the piezoelectric device 300, the excitation electrode 131 at the −Y'-axis side and the second connection electrode 224B at the −X-axis side do not contact nor electrically connect with each other; and when the second piezoelectric oscillating plate 130B is disposed in the piezoelectric device 300, the extraction electrodes 132 can still be electrically connected with the second connection electrodes 224B by connecting the extraction electrodes 132 with second connection electrodes 224B via the electrically-conductive adhesive agent 141. Moreover, the length of the third piezoelectric oscillating plate 130C in the X-axis direction being shorter than that of the second piezoelectric oscillating plate 130B can also be disposed in the piezoelectric device 300. Further, the pair of extraction electrodes 132 of the third piezoelectric oscillating plate 130C are respectively connected with the second connection electrodes 224B electrically by using the electrically-conductive adhesive agent 141 (see FIG. 7B).

Third Embodiment

The second embodiment describes the piezoelectric device 200 and the piezoelectric device 300, which respectively include two types of connection electrodes, i.e. first connection electrodes and second connection electrodes. The third embodiment describes a package 420, which includes a first connection electrode and a second connection electrode that have shapes different from those of the first connection electrode and the second connection electrode in the second embodiment, and further describes a piezoelectric device 400 including the package 420. In the third embodiment, elements the same as those in the first and the second embodiments are indicated by the same reference numerals, and thus the descriptions thereof are omitted hereinafter.

<Structure of Package 420>

Figure 8A:
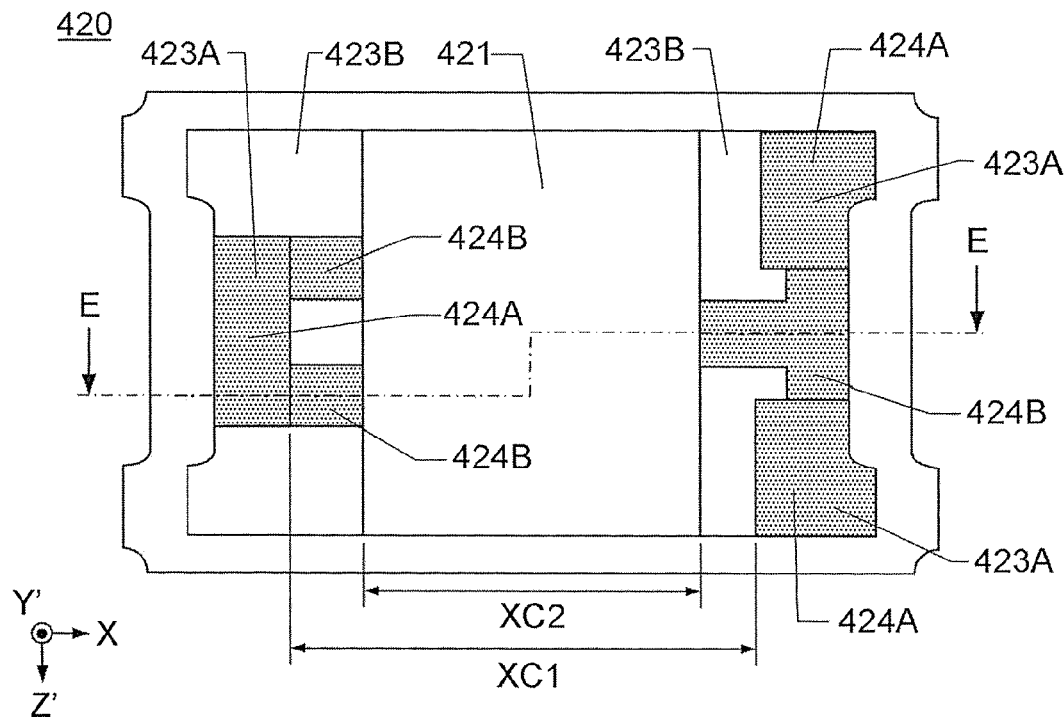
FIG. 8A is a plane view of a package 420.

FIG. 8A is a plane view of the package 420. A concave 421 is formed on a surface of the package 420 at the +Y'-axis side. Second carrier sections 423B and first carrier sections 423A formed on the second carrier sections 423B are formed in the concave 421. The second carrier sections 432B are respectively formed on the +X-axis side and the −X-axis side of the concave 421. The first carrier sections 423A are respectively formed on the +Z'-axis side and the −Z'-axis side of the +X-axis side of the second carrier section 423B at the +X-axis side, and on a central section of the −X-axis side of the section carrier section 423B at the −X-axis side. First connection electrodes 424A are formed on surfaces of the first carrier sections 423A at the +Y'-axis side, and second connection electrodes 424B are formed on the second carrier sections 423B. A distance between the first carrier sections 423A formed at the −X-axis side and the +X-axis side is defined as XC1, and a distance between the second carrier sections 423B formed at the −X-axis side and the +X-axis side is defined as XC2. Moreover, in the package 420, the distance XC1 is a distance between the first connection electrodes 424A formed at the −X-axis side and the +X-axis side, and the distance XC2 is a distance between the second connection electrodes 424B formed at the −X-axis side and the +X-axis side. Herein, the distance XC1 is larger than the distance XC2.

<Piezoelectric Device 400 Applying First Piezoelectric Oscillating Plate 130A>

Figure 8B:
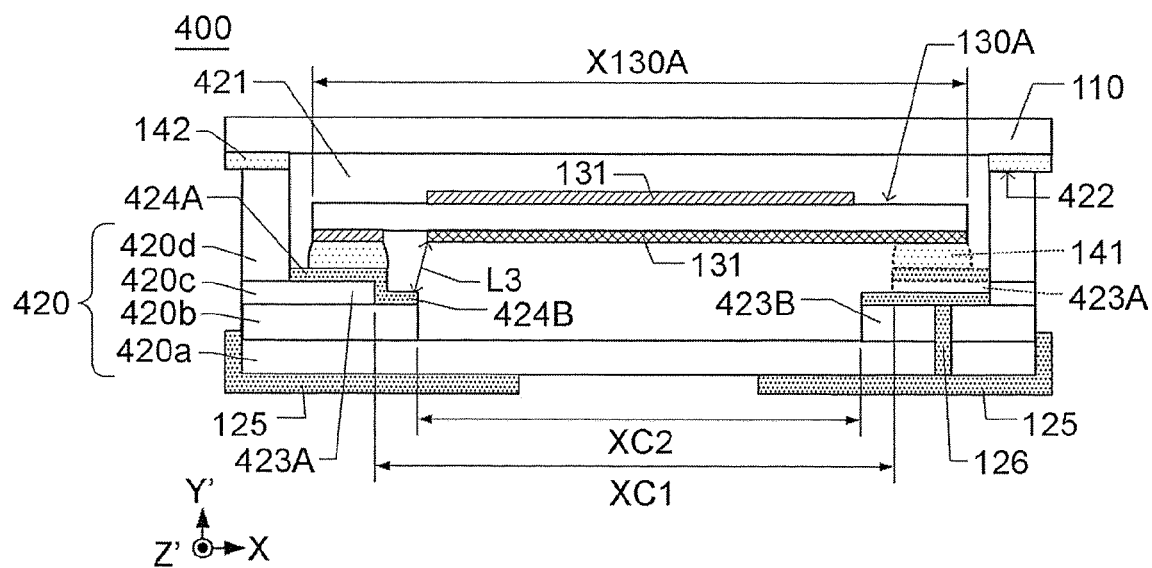
FIG. 8B is a cross-sectional view of a piezoelectric device 400.

FIG. 8B is a cross-sectional view of the piezoelectric device 400. FIG. 8B is a cross-section along the line E-E in FIG. 8A. The piezoelectric device 400 includes the package 420 and the lid 110. The piezoelectric device 400 illustrated in FIG. 8B further includes the first piezoelectric oscillating plate 130A. The package 420 is formed by four layers. A first layer 420a is formed into a planar shape and disposed at the −Y'-axis side of the package 420. The external electrodes 125 are formed on a surface of the first layer 420a at the −Y'-axis side. A second layer 420b is disposed on the +Y'-axis side of the first layer 420a. A through hole is formed in a central section of the second layer 420b to constitute a part of the concave 421. Moreover, the second layer 420b forms the second carrier sections 423B, on which the second connection electrodes 424B are formed. A third layer 420c is disposed on the second layer 420b. A through hole is formed in a central section of the third layer 420c to constitute a part of the concave 421. In addition, the third layer 420c forms the first carrier sections 423A, and the first connection electrodes 424A are formed on the first carrier sections 423A. A fourth layer 420d is disposed on the third layer 420c. A bonding surface 422 is formed on a surface of the fourth layer 420d at the +Y'-axis side. The bonding surface 422 and the lid 110 are bonded to each other by the sealant material 142. Because the first connection electrodes 424A are formed on the third layer 420c and the second connection electrodes 424B are formed on the second layer 420b, the first connection electrodes 424A are formed higher than the second connection electrodes 424B at the +Y'-axis side by a thickness of the third layer 420c. Therefore, a shortest distance L3 between the excitation electrode 131 formed on the −Y'-axis side of the first piezoelectric oscillating plate 130A and the second connection electrodes 424B formed at the −X-axis side is sufficient to keep the excitation electrode 131 at the −Y'-axis side from contacting the second connection electrodes 424B at the −X-axis side. The first connection electrodes 424A are electrically connected with the second connection electrodes 424B, and the second connection electrodes 424B are electrically connected with the external electrodes 125 via the through electrode 126 that passes through the package 420. The first length X130A of the first piezoelectric oscillating plate 130A is longer than the distance XC1 and the distance XC2.

Figure 9A:
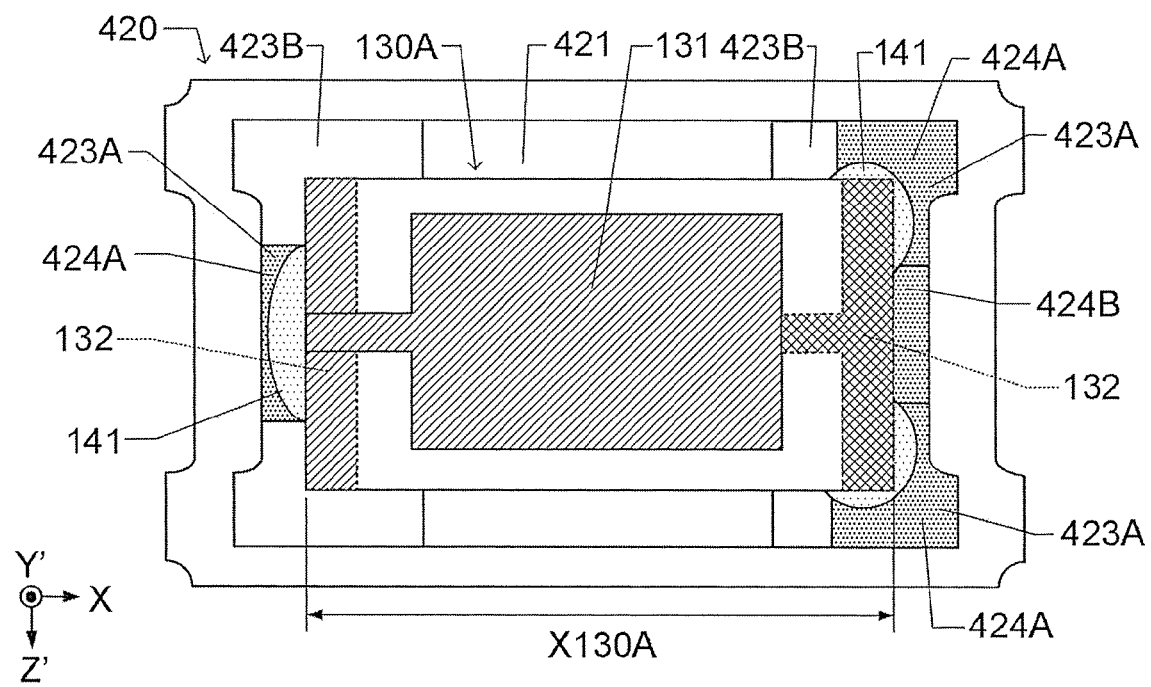
FIG. 9A is a plane view of the package 420, in which the first piezoelectric oscillating plate 130A is disposed.

FIG. 9A is a plane view of the package 420, in which the first piezoelectric oscillating plate 130A is disposed. Referring to FIG. 9A, the extraction electrodes 132 are bonded to the first connection electrodes 424A via the electrically-conductive adhesive agent 141, and the first piezoelectric oscillating plate 130A is disposed on the first carrier sections 423A. In addition, because the first piezoelectric oscillating plate 130A is fixed on the first carrier sections 423A at three points, in which two points are at the +X-axis side and one point is at the −X-axis side, the first piezoelectric oscillating plate 130A is stably disposed in the package 420.
<Piezoelectric Device 400 applying Second Piezoelectric Oscillating Plate 130B>

Figure 9B:
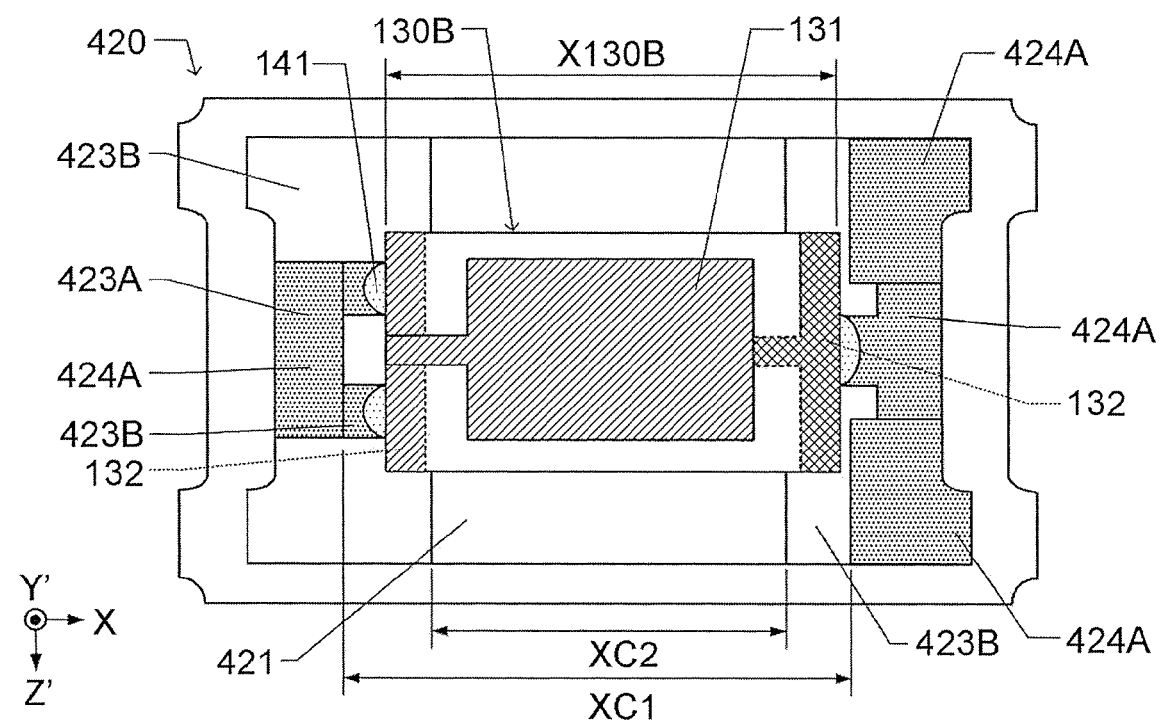
FIG. 9B is a plane view of the package 420, in which the second piezoelectric oscillating plate 130B is disposed.

FIG. 9B is a plane view of the package 420, in which the second piezoelectric oscillating plate 130B is disposed. The second length X130B of the second piezoelectric oscillating plate 130B is shorter than the distance XC1 and longer than the distance XC2. Referring to FIG. 9B, the second piezoelectric oscillating plate 130B is disposed on the second carrier sections 423B, and the second connection electrodes 424B are bonded with the extraction electrodes 132 via the electrically-conductive adhesive agent 141. Because the second piezoelectric oscillating plate 130B is fixed on the second carrier sections 423B at three points, in which two points are at the −X-axis side and one point is at the +X-axis side, the second piezoelectric oscillating plate 130B is stably disposed in the package 420.

In the piezoelectric device 400, the first piezoelectric oscillating plate 130A or the second piezoelectric oscillating plate 130B is fixed in the package 420 at three points; hence, the piezoelectric oscillating plate can be stably disposed in the piezoelectric device 400 regardless of its size. Moreover, in the piezoelectric device 400 of which the first piezoelectric oscillating plate 130A is disposed, since the first carrier sections 423A is formed separated from the second carrier sections 423B by the thickness of the third layer 420c in the +Y'-axis direction, the shortest distance L3 between the second connection electrode 424B formed at the −X-axis side and the excitation electrode 131 formed on the surface at the −Y'-axis side is sufficient to keep the excitation electrode 131 on the −Y'-axis side and the second connection electrode 424B at the −X-axis side from contacting each other. For this reason, even though the first piezoelectric oscillating plate 130A is disposed in the piezoelectric device 400, the excitation electrode 131 at the −Y'-axis side and the second connection electrode 424B do not contact or electrically connect with each other (see FIG. 8B). In addition, in the piezoelectric device 400 where the second piezoelectric oscillating plate 130B having the shorter length in the X-axis direction is disposed, the extraction electrodes 132 can be electrically connected with the second connection electrodes 424B (see FIG. 9B) by connecting the extraction electrodes 132 with the second connection electrodes 424B via the electrically-conductive adhesive agent 141. Furthermore, by making the package 420 the same as the package 320 (see FIG. 7A), and setting the distance between the second connection electrodes at the −X-axis side and the +X-axis side as XC2 and a distance between the second carrier sections at the −X-axis side and the +X-axis side as XC3 (not shown), the third piezoelectric oscillating plate 130C (see FIG. 7B), in which a length thereof is shorter than that of the second piezoelectric oscillating plate 130B in the X-axis direction, can also be disposed by making the distance XC3 to be shorter than the distance XC2. Herein, the third length X130C, i.e. the length of the third piezoelectric oscillating plate 130C in the X-axis direction (see FIG. 7B), is longer than the distance XC3 and shorter than the distance XC2.

Fourth Embodiment

A piezoelectric oscillating plate of different sizes can be also disposed in a piezoelectric device by tilting the piezoelectric oscillating plate. The following disclosure describes a piezoelectric device 500, which includes a package 520 capable of accommodating a piezoelectric oscillating plate of different sizes by tilting the piezoelectric oscillating plate.
<Structure of Package 520>

Figure 10A:
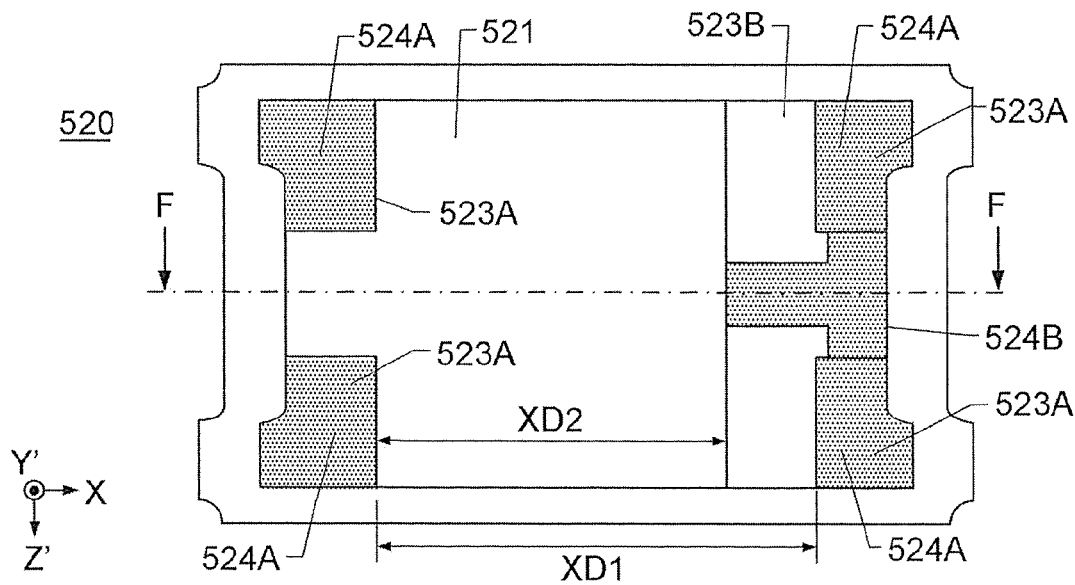
FIG. 10A is a plane view of a package 520.

FIG. 10A is a plane view of the package 520. A concave 521 is formed on a surface of the package 520 at the +Y'-axis side. In the concave 521, second carrier sections 523B (see FIG. 10B) and first carrier sections 523A formed on the second carrier sections 523B are formed. The second carrier sections 523B are respectively formed on the +Z'-axis side and the −Z'-axis side of the −X-axis side of the concave 521 and on the +X-axis side of the concave 521. Moreover, the first carrier sections 523A are respectively formed on the +Z'-axis side and the −Z'-axis side of the +X-axis side of the second carrier section 523B at the +X-axis side, and on the second carrier section 523B at the −X-axis side. First connection electrodes 524A are respectively formed on surfaces of the first carrier sections 523A at the +Y'-axis side, and a second connection electrode 524B is formed on the second carrier section 523B at the +X-axis side. A distance between the first carrier sections 523A formed at the −X-axis side and the +X-axis side is defined as XD1, and a distance between the second carrier sections 523B formed at the −X-axis side (see FIG. 10B) and at the +X-axis side is defined as XD2. Moreover, in the package 520, the distance XD1 is a distance between the first connection electrodes 524A formed at the −X-axis side and the +X-axis side, and the distance XD2 is a distance between the first connection electrodes 524A formed at the −X-axis side and the second connection electrode 524B at the +X-axis side. Herein, the distance XD1 is larger than the distance XD2.

<Piezoelectric Device 500 Using Fourth Piezoelectric Oscillating Plate 130D>

Figure 10B:
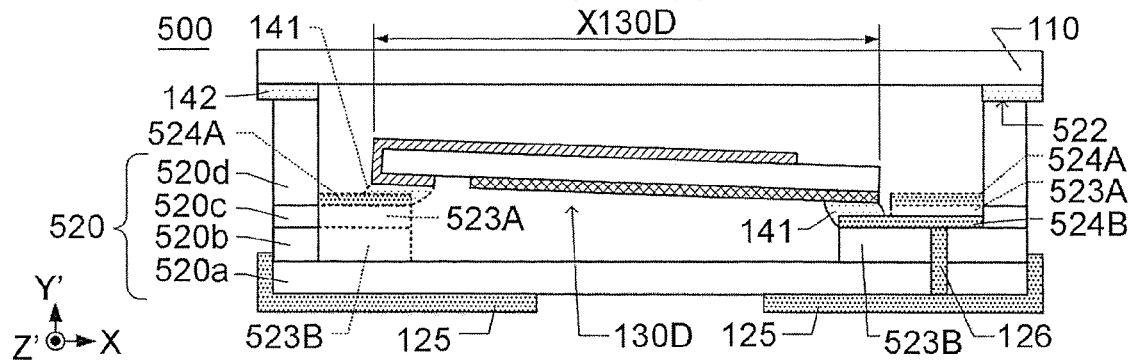
FIG. 10B is a cross-sectional view of a piezoelectric device 500.

FIG. 10B is a cross-sectional view of the piezoelectric device 500. FIG. 10B is a cross-sectional view along the line F-F in FIG. 10A and FIG. 10C as described below. The piezoelectric device 500 includes the package 520 and the lid 110. Moreover, the piezoelectric device 500 shown in FIG. 10B further includes a fourth piezoelectric oscillating plate 130D. The package 520 is formed by four layers. A first layer 520a is formed into a planar shape and disposed at the −Y'-axis side of the package 520. The external electrodes 125 are formed on a surface of the first layer 520a at the −Y'-axis side. A second layer 520b is disposed on the +Y'-axis side of the first layer 520a. A through hole is formed in a central section of the second layer 520b to constitute a part of the concave 521. In addition, the second layer 520b forms the second carrier sections 523B and the second connection electrode 524B is formed on the second carrier section 523B at the +X-axis side. A third layer 520c is disposed on the second layer 520b, and a through hole is formed in a central section of the third layer 520c to constitute a part of the concave 521. Furthermore, the third layer 520c forms the first carrier sections 523A, and the first connection electrodes 524A are formed on the first carrier sections 523A respectively. A fourth layer 520d is disposed on the third layer 520c. A bonding surface 522 is formed on a surface of the fourth layer 520d at the +Y'-axis side, and the bonding surface 522 and the lid 110 are bonded to each other by the sealant material 142. The fourth piezoelectric oscillating plate 130D is connected with the first connection electrodes 524A at the −X-axis side and the second connection electrode 524B at the +X-axis side via the electrically-conductive adhesive agent 141. Because the first connection electrodes 524A and the second connection electrode 524B have different heights in the Y'-axis direction, the fourth piezoelectric oscillating plate 130D is tilted relative to an X-Z' plane when it is being disposed in the package 520. In addition, when the fourth piezoelectric oscillating plate 130D is disposed in the package 520, a width of the fourth piezoelectric oscillating plate 130D in the X-axis direction is defined as X130D, and the width X130D is longer than the distance XD2 and shorter than the distance XD1.

Figure 10C:
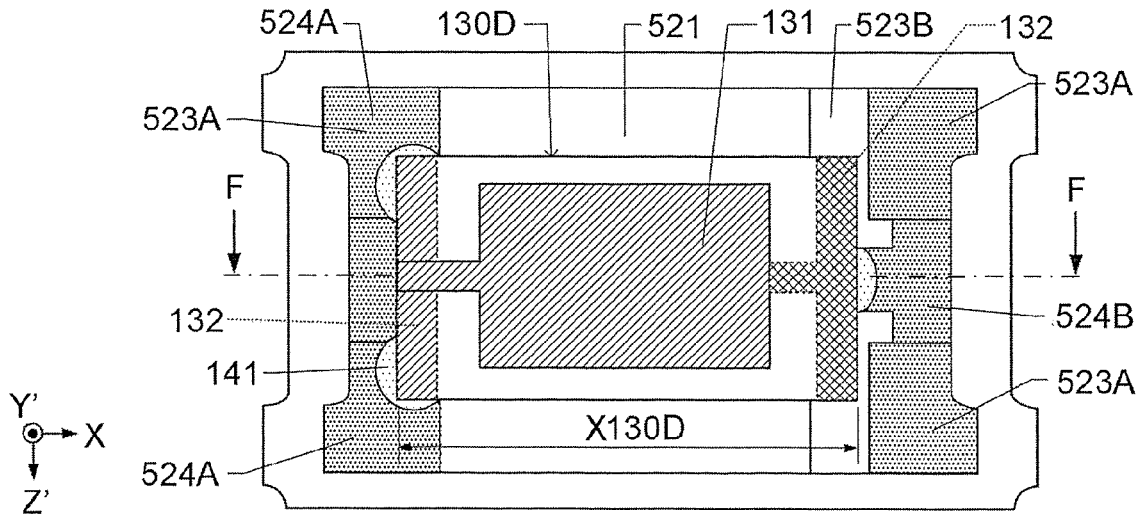
FIG. 10C is a plane view of the package 520, in which a fourth piezoelectric oscillating plate 130D is disposed.

FIG. 10C is a plane view of the package 520, in which the fourth piezoelectric oscillating plate 130D is disposed. The fourth piezoelectric oscillating plate 130D is connected with the second connection electrode 524B at the +X-axis side and connected with the first connection electrodes 524A at the −X-axis side. In addition, the fourth piezoelectric oscillating plate 130D is fixed in the package 520 at three points, in which one point is at the +X-axis side and two points are at the −X-axis side; thus, the fourth piezoelectric oscillating plate 130D is stably disposed in the package 520.

In piezoelectric device 500, when the first piezoelectric oscillating plate 130A, in which the length thereof is longer than the distance XD1 in the X-axis direction, is used, the distance XD1 is formed in a way that the excitation electrode 131 on the −Y'-axis side of the first piezoelectric oscillating plate 130A does not contact the first connection electrodes 524A at the −X-axis side. Accordingly, even though the first piezoelectric oscillating plate 130A is disposed, the excitation electrode 131 at the −Y'-axis side and the first connection electrodes 524A at the −X-axis side do not contact or electrically connect with each other. In addition, the fourth piezoelectric oscillating plate 130D, in which a length thereof is shorter than the distance XD1 in the X-axis direction, can be used in the piezoelectric device 500 through connecting the extraction electrodes 132 with the second connection electrode 524B at the +X-axis side and the first connection electrodes 524A at the −X-axis side, as shown in FIG. 10B. By extending a length of the second connection electrode 524B in the X-axis direction and shortening the distance XD2, the width X130D of the fourth piezoelectric oscillating plate 130D in the X-axis direction can be shorter.

The exemplary embodiments of the invention have been described in detail above. However, it is clear to persons skilled in the art that modifications or variations may be made to the embodiments without changing the scope or spirit of the invention.

For example, in the second to the fourth embodiments, two levels of carrier sections, i.e. the first carrier sections and the second carrier sections, are formed. However, three levels or more than three levels of carrier sections may also be formed. In that case, the piezoelectric device can accommodate a piezoelectric oscillating plate that has an even smaller size. Moreover, the piezoelectric device can also be a piezoelectric oscillator where an integrated circuit is disposed.

Furthermore, the piezoelectric oscillating plate described in the above embodiments is an AT-cut crystal oscillating plate; however, a BT-cut crystal oscillating plate, which also oscillates by thickness-shear mode, or a tuning-fork-type crystal oscillating plate is also applicable. Moreover, the material of the piezoelectric oscillating plate is not limited to a crystal material. $LiTaO_3$, $LiNbO_3$, or a piezoelectric material containing piezoelectric ceramics is basically suitable.

What is claimed is:

1. A piezoelectric device, comprising:
a first piezoelectric oscillating plate having a first length in a predetermined direction, or a second piezoelectric oscillating plate having a second length shorter than the first length in the predetermined direction,
wherein the first piezoelectric oscillating plate comprises a pair of excitation electrodes and a pair of extraction electrodes respectively extending from the pair of excitation electrodes toward a side and an opposite side of the first piezoelectric oscillating plate,
the second piezoelectric oscillating plate comprises a pair of excitation electrodes and a pair of extraction electrodes respectively extending from the pair of excitation electrodes toward a side and an opposite side of the second piezoelectric oscillating plate,
the pair of extraction electrodes are respectively electrically connected with connection electrodes disposed at two sides in a package in the predetermined direction via an electrically-conductive adhesive agent,
the package comprises carrier sections for carrying the first or the second piezoelectric oscillating plate thereon, the carrier sections are respectively formed at one side and the other side in the predetermined direction, and the connection electrodes are respectively formed on at least a portion of surfaces of the carrier sections,
wherein, when the extraction electrodes of the first piezoelectric oscillating plate are respectively electrically connected with the connection electrodes, the excitation electrode on one side of the first piezoelectric oscillating plate is not electrically connected with the connection electrode that connects the extraction electrode extending from the excitation electrode on an other side of the first piezoelectric oscillating plate; and
wherein the extraction electrodes of the second piezoelectric oscillating plate are electrically connected with the connection electrodes, the second piezoelectric oscillating plate is not disposed on the connection electrodes, and the electrically-conductive adhesive agent is extended to electrically connect the connection electrodes with the extraction electrodes.

2. The piezoelectric device according to claim 1, wherein the carrier sections at the one side or the other side comprise second carrier sections and first carrier sections respectively formed on the second carrier sections; and each of the connection electrodes comprises a first connection electrodes formed on the first carrier sections and a second connection electrodes formed on the second carrier section,
wherein the first connection electrodes are respectively electrically connected with the extraction electrodes of the first piezoelectric oscillating plate, and
the second connection electrodes are electrically connected with the extraction electrodes of the second piezoelectric oscillating plate.

3. The piezoelectric device according to claim 1, wherein the carrier sections at the one side or the other side comprise second carrier sections and first carrier sections respectively formed on the second carrier sections; and each of the connection electrodes comprises a first connection electrodes formed on the first carrier sections and a second connection electrodes formed on the second carrier section,
wherein the extraction electrodes of the first piezoelectric oscillating plate are electrically connected with the first connection electrodes,
the extraction electrode extending to one side of the second piezoelectric oscillating plate is electrically connected with the first connection electrodes, and
the extraction electrode extending to another side of the second piezoelectric oscillating plate is electrically connected with the second connection electrodes.

4. The piezoelectric device according to claim 2, wherein the second connection electrode forms an end section that is closer to an inside of the package than the first connection electrode in the predetermined direction.

5. The piezoelectric device according to claim 3, wherein the second connection electrode forms an end section that is closer to an inside of the package than the first connection electrode in the predetermined direction.

6. A piezoelectric device, comprising:
a lid;
a package, bonded to the lid, and capable of accommodating a first piezoelectric oscillating plate having a first length in a predetermined direction, or a second piezoelectric oscillating plate having a second length shorter than the first length in the predetermined direction,
wherein the first piezoelectric oscillating plate comprises a pair of excitation electrodes and a pair of extraction electrodes respectively extending from the pair of excitation electrodes toward a side and an opposite side of the first piezoelectric oscillating plate,
the second piezoelectric oscillating plate comprises a pair of excitation electrodes and a pair of extraction electrodes respectively extending from the pair of excitation electrodes toward a side and an opposite side of the second piezoelectric oscillating plate,
the package comprises carrier sections for carrying the first or the second piezoelectric oscillating plate thereon, the carrier sections are respectively formed at one side and the other side in the predetermined direction, and connection electrodes are respectively formed on at least a portion of surfaces of the carrier sections,
the pair of extraction electrodes are respectively electrically connected with the connection electrodes via an electrically-conductive adhesive agent,
when the extraction electrodes of the first piezoelectric oscillating plate are respectively electrically connected with the connection electrodes, the excitation electrode on one side of the first piezoelectric oscillating plate is not electrically connected with the connection electrode that connects the extraction electrode extending from the excitation electrode on the other side of the first piezoelectric oscillating plate; and
the extraction electrodes of the second piezoelectric oscillating plate are electrically connected with the connection electrodes,
the second piezoelectric oscillating plate is not disposed on the connection electrodes, and the electrically-conductive adhesive agent is extended to electrically connect the connection electrodes with the extraction electrodes.

7. The piezoelectric device according to claim 6, wherein the carrier sections at the one side or the other side comprise second carrier sections and first carrier sections respectively formed on the second carrier sections; and each of the connection electrodes comprises a first connection electrode formed on the first carrier section and a second connection electrode formed on the second carrier section,
wherein the first connection electrodes are respectively electrically connected with the extraction electrodes of the first piezoelectric oscillating plate, and
the second connection electrodes are electrically connected with the extraction electrodes of the second piezoelectric oscillating plate.

8. The piezoelectric device according to claim 6, wherein the carrier sections at the one side or the other side comprise second carrier sections and first carrier sections respectively formed on the second carrier sections; and each of the connection electrodes comprises a first connection electrode formed on the first carrier section and a second connection electrode formed on the second carrier section,
wherein the extraction electrodes of the first piezoelectric oscillating plate are electrically connected with the first connection electrodes,
the extraction electrode extending to one side of the second piezoelectric oscillating plate is electrically connected with the first connection electrodes, and
the extraction electrode extending to another side of the second piezoelectric oscillating plate is electrically connected with the second connection electrodes.

9. The piezoelectric device according to claim 7, wherein the second connection electrode forms an end section that is closer to an inside of the package than the first connection electrode in the predetermined direction.

10. The piezoelectric device according to claim 8, wherein the second connection electrode forms an end section that is closer to an inside of the package than the first connection electrode in the predetermined direction.

* * * * *